United States Patent [19]
Yamagata

[11] Patent Number: 5,236,544
[45] Date of Patent: Aug. 17, 1993

[54] PROCESS FOR GROWING CRYSTAL

[75] Inventor: Kenji Yamagata, Kawasaki, Japan

[73] Assignee: Canon Kabushiki Kaisha, Tokyo, Japan

[21] Appl. No.: 543,417

[22] Filed: Jun. 26, 1990

[30] Foreign Application Priority Data

Jun. 26, 1989 [JP] Japan .................. 1-163430

[51] Int. Cl.$^5$ .................. C30B 25/04
[52] U.S. Cl. .................. 156/603; 156/DIG. 73; 437/24; 437/83; 437/247; 437/946; 148/DIG. 7
[58] Field of Search .................. 156/603, DIG. 73; 148/DIG. 17; 437/83, 247, DIG. 946, 24; 423/350

[56] References Cited

U.S. PATENT DOCUMENTS

| | | | |
|---|---|---|---|
| 4,444,615 | 4/1984 | Matzuzawa et al. | 156/603 |
| 4,755,487 | 7/1988 | Scovell et al. | 437/31 |
| 4,773,964 | 9/1988 | Haond | 156/603 |
| 4,855,014 | 8/1989 | Kakimoto et al. | 156/603 |

FOREIGN PATENT DOCUMENTS

| | | | |
|---|---|---|---|
| 244081A | 11/1987 | European Pat. Off. | 156/610 |
| 0307109 | 3/1989 | European Pat. Off. | |
| 0325964 | 3/1987 | Japan | 156/603 |
| 0119914 | 6/1987 | Japan | 156/603 |
| 0210920 | 6/1987 | Japan | 156/603 |

Primary Examiner—Robert Kunemund
Attorney, Agent, or Firm—Fitzpatrick, Cella, Harper & Scinto

[57] ABSTRACT

A process of growing a monocrystal on an insulating film provided on a metal electrode, which comprises: providing a semiconductor film on a substrate having a metal electrode and an insulating film; causing the semiconductor film and the insulating film to undergo the solid phase reaction at the interface therebetween; forming a monocrystalline cohering body of the semiconductor film at the opening of the insulating film by applying annealing for cohesion of the semiconductor film on the metal electrode; and allowing a monocrystal to grow with the monocrystalline cohering body as a seed.

28 Claims, 7 Drawing Sheets

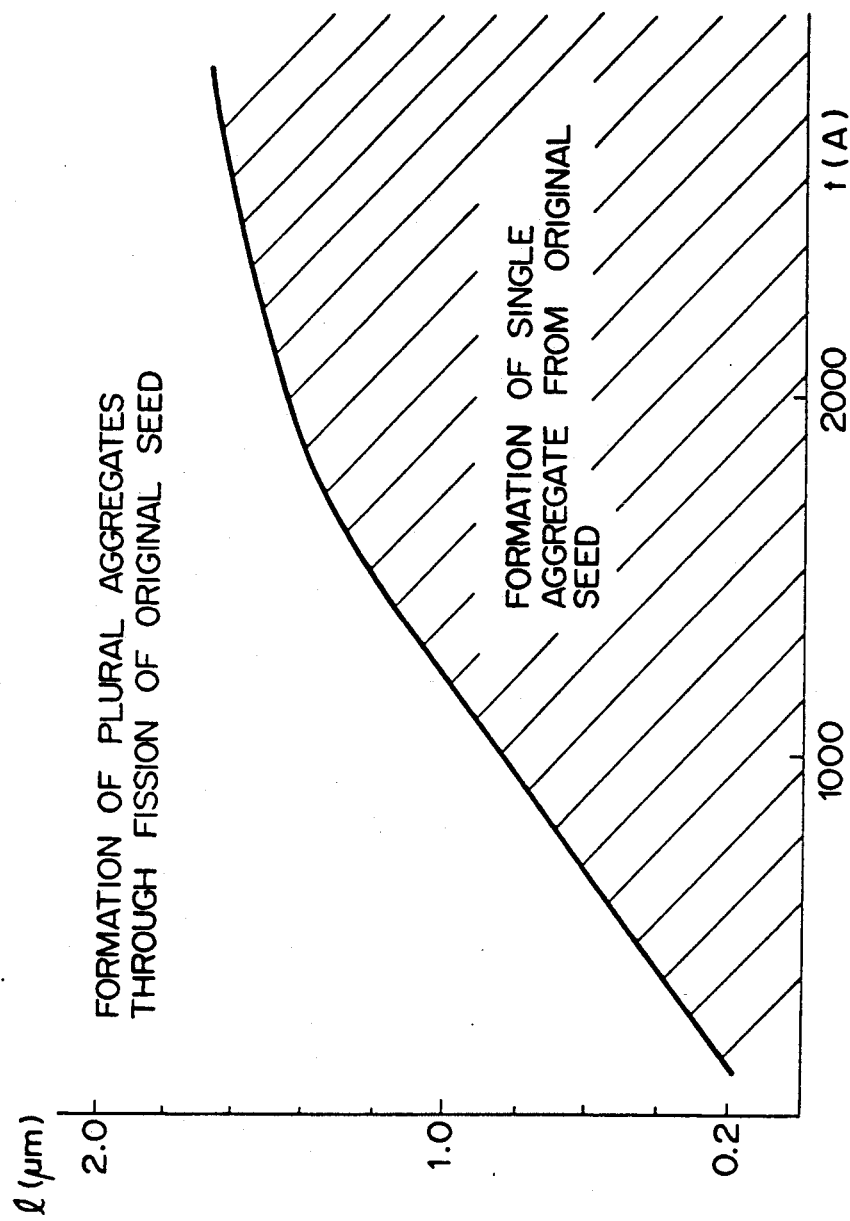

PROCESS FOR GROWING CRYSTAL

BACKGROUND OF THE INVENTION

1. Field of the Invention

This invention relates to a process for growing a crystal to be used in, for example, electronic devices, optical devices, magnetic devices, piezoelectric devices or surface acoustic devices such as semiconductor integrated circuit, optical integrated circuit, magnetic circuit, etc. Particularly, it pertains to a growth method of a crystal to be used suitably for formation of solar battery, etc.

2. Related Background Art

In the prior art, in solar batteries, package MOS transistors, etc., there have been invented devices of the SOI structure of the mode forming an insulating film on a metal, forming an opening at a part of the insulating film and making contact with the metal surface exposed from the opening.

However, for forming a high performance device by use of the above-mentioned mode, the technique for forming a monocrystal of a semiconductor on the insulating film in contact partially with the metal surface and the technique for making sufficient ohmic contact at the interface between the metal and the semiconductor are demanded. One which has made it substantially realizable is the selective nucleation method developed separately by the Applicant of the present application, as disclosed in Japanese Laid-open Patent Application No. 63-107016, EP 244081A1. The selective nucleation method proposed by the present Applicant is inclusive of the technique of generating a nucleus which can become a monocrystal by growing on a fine metal surface by the gas phase method, and growing a crystal from the nucleus of said crystal.

However, according to this method, since the method of generating a nucleus of a semiconductor monocrystal on a fine metal surface by the gas phase method and growing a crystal from the nucleus of said crystal, it was sometimes difficult to form a crystal containing an impurity at high concentration depending on the formation conditions. Therefore, in some cases, the ohmic contact between the metal and the semiconductor surface may be insufficient.

Also, there is an Si wafer in which an impurity is diffused into the back surface, then a metal is deposited by sputtering vapor deposition, etc. to form an electrode, as used in constituting the most basic solar battery. However, in this constitution, process treatments must be applied on both the front and back surfaces of the device, and additionally an Si wafer is used. Therefore, the shape and the size of the device are necessarily restricted, whereby the cost is high, as well as involving technical difficulty, and such technique was extremely disadvantageous in enlargement of area.

As described above, in the so-called SOI structure having a semiconductor film provided on an insulating film having a contact hole (opening) on a lower electrode, there is involved the problem in utilization of a monocrystal having good electrical contact with the lower electrode, and also when employing a wafer, there are involved problems with respect to reduction of cost, simplification of the steps and enlargement of area, whereby there remained tasks for achieving higher performance and practical application of the device.

SUMMARY OF THE INVENTION

An object of the present invention is to cancel the problems of the prior art as described above and provide a method for growing a crystal capable of forming a point contact type SOI structure with a monocrystal and a metal surface, which can be easily integrated three-dimensionally and enlarged in area and has excellent characteristics.

Another object of the present invention is to provide a method for growing a crystal, which when applying a seed for crystal growth only at the contact hole with the metal surface being exposed, can leave a semiconductor film in a self-alignment fashion to remain only at the contact hole, and also modify the remaining semiconductor film to a monocrystalline seed only by applying a simple operation of annealing the non-monocrystalline semiconductor film formed on the substrate.

Still another object of the present invention is to provide a method for growing a crystal which can achieve the following three effects at one time by applying one operation of annealing, namely:

(i) the self-alignment effect to the contact point of a semiconductor material by the solid phase reaction;

(ii) monocrystal formation by cohesion of a polycrystalline semiconductor film or an amorphous semiconductor film (non-monocrystalline film) on an electrode; and (iii) that ohmic contact can be made with the above-mentioned cohered monocrystal semiconductor on the metal surface.

Still another object of the present invention is to provide a method for growing a crystal, which also enables growth of a Si monocrystal of the SOI type on, for example, a metal substrate, thereby enabling a device of low cost and high performance such as semiconductor integrated circuit, optical integrated circuit, magnetic circuit, solar battery, etc.

Still another object of the present invention is to provide a crystal growth method which grows a monocrystal on an insulating film provided on a metal electrode, characterized in that:

a semiconductor film is provided on a substrate having a metal electrode and an insulating film, said semiconductor film and said insulating film undergo the solid phase reaction at the interface therebetween, a monocrystalline cohering body of said semiconductor film is formed at the opening of said insulating film by applying annealing for cohesion of said semiconductor film on said metal electrode, and a monocrystal is permitted to grow with said single crystalline cohered body as the seed.

Still another object of the present invention is to provide a crystal growth method which grows a semiconductor monocrystal on an insulating film having an opening provided on a metal electrode, characterized in that:

a non-monocrystalline semiconductor thin film is provided so as to cover over a substrate having said insulating film and a metal electrode surface exposed from the opening of said insulating film with a thickness which is thinner than that of said insulating film, said semiconductor thin film is annealed thereby to effect the solid phase reaction between the insulating film and the semiconductor film, whereby only the semiconductor thin film existing on the insulating film is removed, and also the semiconductor thin film on the metal electrode is allowed to cohere to form a cohering body formed into a monocrystal, and a crystal is permitted to grow with said cohering body as the seed.

Still another object of the present invention is to provide a crystal growth method which grows a monocrystal on an insulating film provided on a metal electrode, characterized in that:

a semiconductor film which is non-monocrystalline and subjected to patterning is provided on said insulating film of a substrate having the metal electrode and the insulating film, said semiconductor film is annealed thereby to effect the solid phase rection between said semiconductor film and said insulating film, whereby said insulting film at the portion where said semiconductor film subjected to patterning is removed to effect cohesion of said semiconductor film on said metal electrode and form an cohered body formed into a monocrystal, and a monocrystal is permitted to grow with said cohered body as the seed.

BRIEF DESCRIPTION OF THE DRAWINGS

FIG. 3 is a graph for showing the typical conditions for forming a single monocrystalline Si by the cohesion reaction;

DETAILED DESCRIPTION OF EMBODIMENTS

According to the crystal growth method of the present invention, first by annealing the semiconductor film formed on a substrate having a metal electrode and an insulating film having an opening provided on the metal electrode, the two phenomena as described below will simultaneously take place.

That is, they are, in the first place, removal of the semiconductor film by the solid phase reaction between the semiconductor film and the insulating film, and in the second place, single crystal formation on the metal electrode by the cohesion reaction of the semiconductor film. In the following, the respective phenomena are described in detail.

(1) Solid Phase Reaction:

In the following, removal of the semiconductor film by the solid phase reaction in the present invention is described by referring to a Si film as an example of the semiconductor film, and a SiO$_2$ film as an example of the insulating film.

Figure 1A:
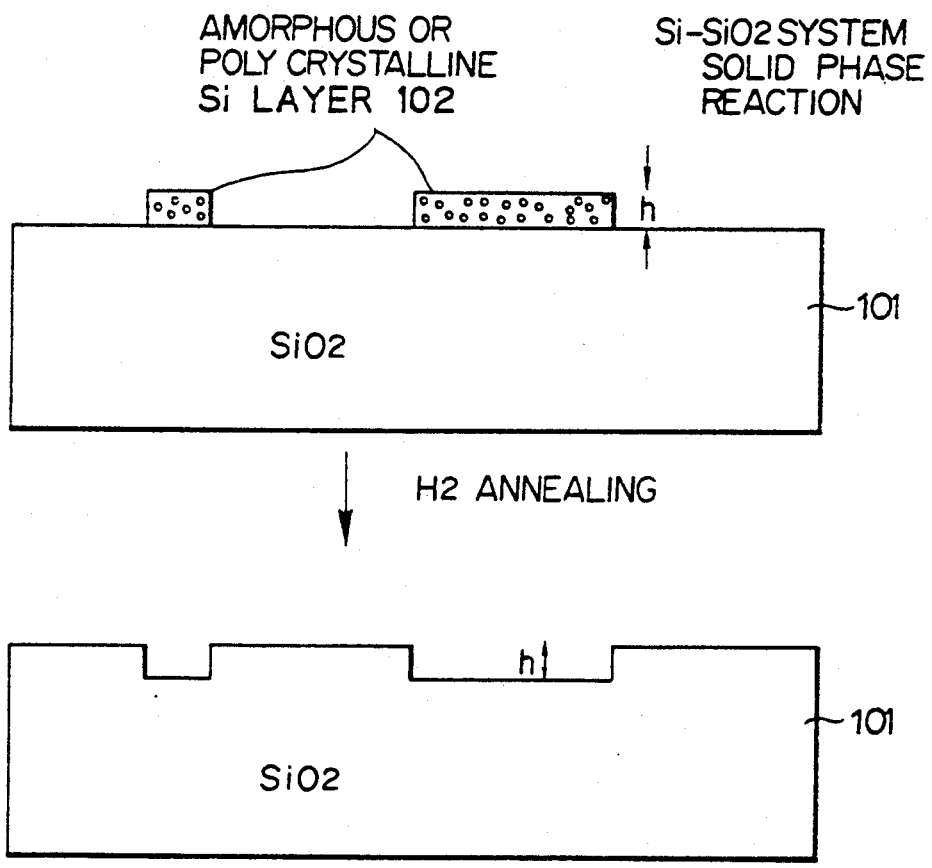
FIGS. 1A and 1B illustrate diagramatically the Si-SiO$_2$ solid phase reactions which enable practice of the present invention.

This is the phenomenon that, when a non-monocrystalline Si film 102 (either polycrystalline or amorphous) is formed on an SiO$_2$ film 101 as shown in FIG. 1A, annealing of this in a reducing gas atmosphere such as a gas containing H$_2$ will cause the reaction between Si and SiO$_2$ to occur as such in the solid phase, thereby forming SiO with high vapor pressure to be sublimated.

This may be considered to be consequently the reaction system of:

$$Si + SiO_2 \rightarrow SiO \uparrow$$

This reaction proceeds so that the thickness of the Si film 102 and the thickness of the SiO$_2$ film 101 undergo the reaction at substantially 1:1 as drawn in FIG. 1A, whereby both the Si film 102 and a part of the SiO$_2$ film 101 will disappear. Also, as shown in FIG. 1A, even if the Si film 102 was not subjected to patterning but is a film covering the whole surface of the SiO$_2$ film 101, such reaction will occur. However, in the case of the film covering the whole surface, the reaction may sometimes occur with difficulty found by experimentation by the present inventors, if the film thickness exceeds about 5000 Å.

Also, the reaction can be accelerated, if an impurity such as P, B, As, etc. is doped in the Si layer 102.

Figure 1B:
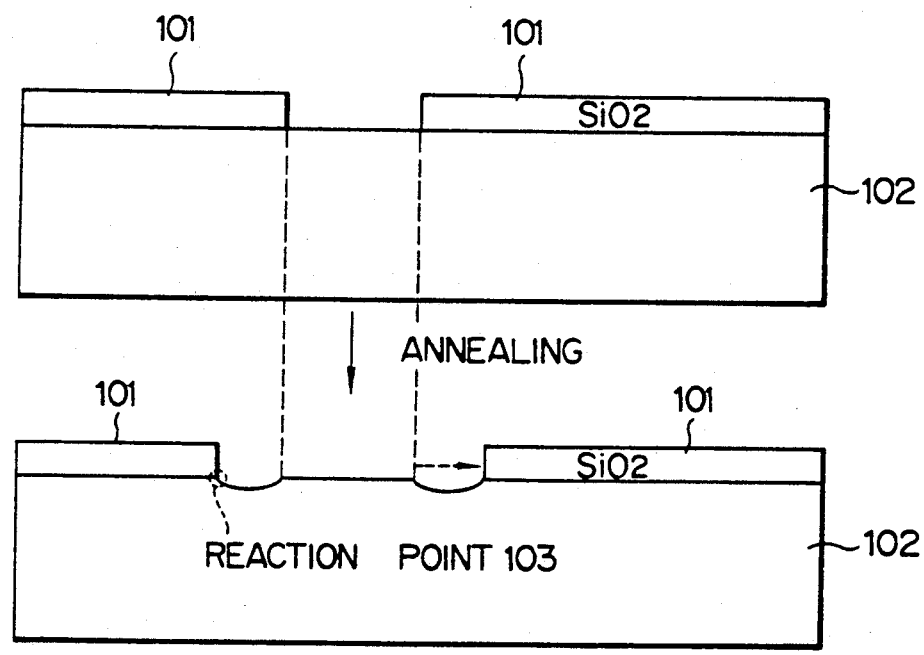

On the contrary, in case where the lower layer is the Si film 102 and the SiO$_2$ film 101 is the cap layer, the reaction will occur only when the SiO$_2$ film 101 is partially opened and the interface (reaction point) 103 between the Si film 102 and the SiO$_2$ film 101 is exposed as shown in FIG. 1B. When the SiO$_2$ film 101 completely covers the surface, substantially no reaction will occur. This reaction can take place at about 850° C. or higher, and readily at about 950° C. or higher. Therefore, the annealing temperature for removing the semiconductor film and the insulating film by the solid phase reaction may be preferably 850° C. or higher and not higher than the melting point of the semiconductor material, more preferably 950° C. to 1200° C., optimally 1000° C. to 1100° C.

For not permitting even the insulating film to disappear through the solid phase reaction as described above, although depending on the combination of the materials, it is desirable to make the film thickness of the semiconductor film thinner than that of the insulating film.

Also, the above-mentioned insulating film can also be provided with an opening by the above-described solid phase reaction. For that purpose, a semiconductor film thicker than the above insulating film may be provided at a desired position for provision of an opening, and the insulating film at the above desired position may be cause to disappear by the above solid phase reaction.

For carrying out efficiently the solid phase reaction as described above, the content of hydrogen gas in the annealing atmosphere should be preferably at least 20 vol. %.

(2) Cohesion Reaction:

The cohesion reaction exhibits the phenomenon that the atoms move even in solid phase to reduce the surface of the above thin film resulting in beads up, as caused by minimumization of the surface energy of the thin film or by relaxation of the internal stress (energy), etc. Accordingly, cohesion in the present invention shows the phenomenon of changing the external shape from the film shape to a shape with smaller surface area such as hemisphere with the stabilization of the energy in the deposition film as the driving force.

Figure 2A:
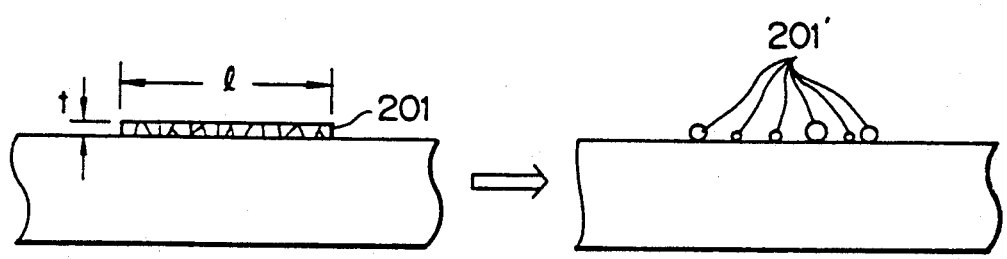
FIGS. 2A to 2C also similarly illustrate diagramatically the cohesion reactions.
Figure 2B:
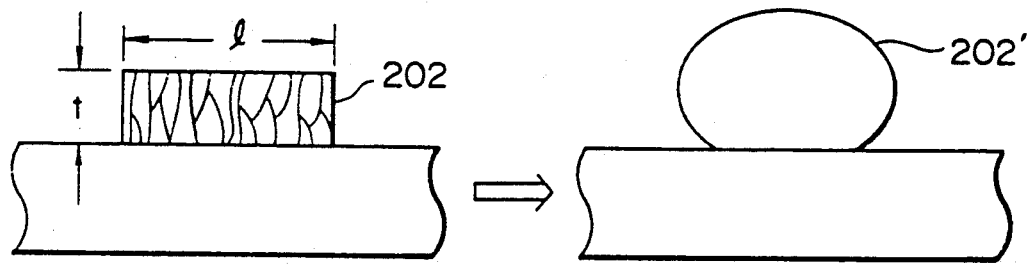
Figure 2C:
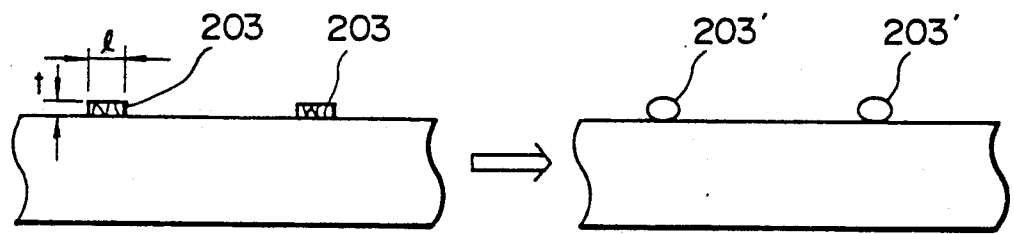

Such phenomenon occurs in a manner with the change of the shape as shown in FIGS. 2A to 2C.

Besides, these occur in the solid phase, namely at a temperature less than the melting point or at the melting point, which will occur more readily when the thickness of the thin film is thinner. For example, a polycrystalline Si film with a thickness of 1000 Å will undergo cohesion reaction at around 1050° C. in hydrogen atmosphere, while a thin film of 500 Å at around 980° C.

Each region cohered was confirmed to be a monocrystal when observed by TEM. In the external shape of each cohered crystal, no facet inherent in Si monocrystal was seen, but it is substantially in hemispherical shape, and the form of its hemisphere is not determined uniformly, but differs in so called "wet angle" depending on the substrate material.

In these cohesion reactions, the most specific phenomenon is that they can take place extremely readily in an atomosphere containing hydrogen gas, whereas cohesion may sometimes occur with difficulty in other atmospheres such as atmospheres only of nitrogen, oxygen, argon, helium, etc. without containing hydrogen gas. Accordingly, for forming a monocrystalline cohered body (seed) at high yield, the annealing atmosphere should be preferably an atmosphere containing hydrogen gas.

Here, the content of hydrogen gas in the annealing atmosphere may be as its upper limit 100%, namely hydrogen gas atmosphere, and as the lower limit 0% (cohesion occurs even when no hydrogen gas is contained in the annealing atmosphere). The hydrogen gas content for forming a monocrystalline seed with good reproducibility and yield and also utilizing efficiently the above solid phase reaction may be preferably 50% to 100%, more preferably 80% to 100%.

For utilizing the cohesive reaction in the present invention, the film thickness and patterning dimension of the polycrystalline film or the amorphous film before cohesion (hereinafter called "original seed") must be selected so that the thin film may be made to cohere into one monocrystal. More specifically, as shown in FIG. 2A, if the patterning dimension l is larger relative to the film thickness t of the thin film 201, cohesion occurs as divided into a plural number, whereby a plural number of cohered bodies 201' are formed. Accordingly, for cohesion into a single body, the film thickness t of the thin film 202 is made thicker as shown in FIG. 2A, so that a single cohered body 202' is formed. Alternatively, without change of the film thickness, the patterning dimension l may be also made smaller to provide a thin film 203, whereby a single cohered body 203' may be formed from a single original seed (FIG. 2C). Thus, a single monocrystal (seed) is formed at any desired position.

FIG. 3 shows a typical example of the relationship between the film thickness t and the patterning dimension l for cohering a single seed crystal.

As can be also seen from FIG. 3, for formation of a single cohered body by annealing of the original seed, an original seed with an appropriate size must be arranged. Thus, in the present invention, the size of the original seed should be desirably sufficiently small to be made to cohere into a monocrystalline seed.

More specifically, the film thickness which can be used is 10000 Å (1 μm) or less, preferably 4000 Å or less, more preferably 2000 Å or less, for formation of a monocrystalline seed with good reproducibility, within short time and at good yield.

As the patterning dimension l, for formation of a single cohered body without division, it is desirable to arrange a semiconductor provided with an opening or patterning so that its maximum diameter may be preferably 5 μm or less, more preferably 0.5 μm to 2 μm. Further, where a dopant of an element of the group III or IV of periodic table, such as B, P, and As, is contained in the original seed, the cohesion reaction is easy to accrue.

As other combinations of the material for the polycrystalline or amorphous non-monocrystalline original seed and the material for insulating material available in the present invention, there may be preferably employed, for example, combinations of semiconductor materials and oxide type insulating materials such as silicon and silicon oxide ($SiO_x$), silicon and silicon oxide nitride ($SiO_xN_y$), germanium and silicon oxide, and germanium and silicon oxide nitride.

EXAMPLE 1

A first example of the present invention is described by referring to FIGS. 4A to 4E. This example has formed a solar battery by utilizing the phenomenon of the present invention.

Figure 4A:
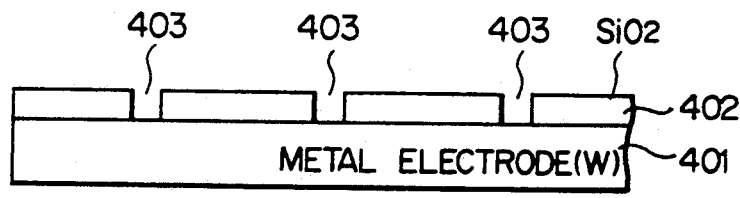
FIGS. 4A to 4E are schematic illustrations of the process for forming a solar battery according to a first example.

(A) By use of tungsten (W) as the lower metal electrode 401, $SiO_2$ film 402 was deposited thereon by the CVD method to 6000 Å. For formation of contact holes 403 of 2 μm × 2 μm on the $SiO_2$ film by use of conventional photolithographic technique, patterning was effected in lattices with 50 μm pitch, followed by etching by the wet process to form contact holes 403 (FIG. 4A).

Figure 4B:
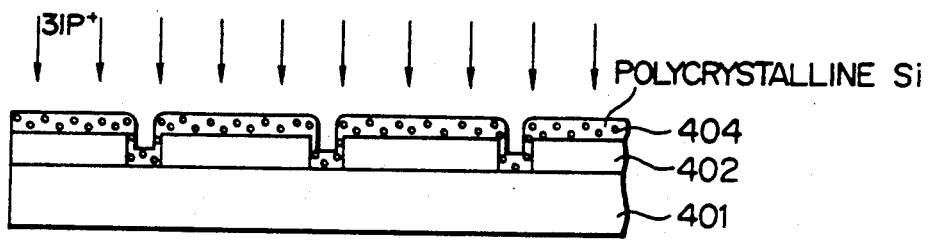

(B) Next, by use of LPCVD, a polycrystalline Si layer 404 was formed to 2000 Å, $^{31}P^+$(phosphorus) ions were ion injected at 40 keV with a doped amount of $1.5 \times 10^{16}$ cm$^{-2}$ (FIG. 4B).

Figure 4C:
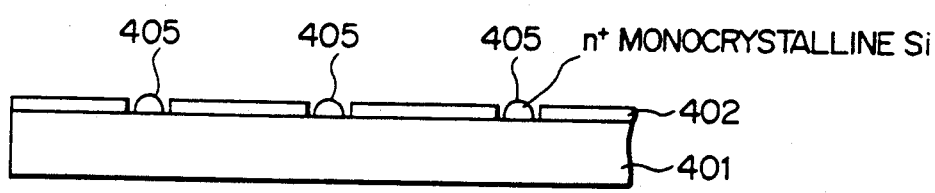

(C) Next, the above substrate was annealed in a hydrogen atmosphere at 1030° C. for 8 minutes. As a result, a polycrystalline Si on $SiO_2$ totally disappeared, and the $SiO_2$ film thickness was found to be changed to about 4000 Å. On the other hand, the polycrystalline Si on the tungsten of the contact hole 403 underwent cohesion on the metal surface to be changed into a cohered body (seed) 405 of the n+ type monocrystal Si (FIG. 4C).

(D) Next, with the cohered body 405 of the n+ monocrystal Si obtained by cohesion as the seed crystal and the $SiO_2$ layer 402 as the mask, crystal growth was performed by use of a crystal growth technique according to the known selective gas phase method under the conditions as shown below.

Figure 4D:
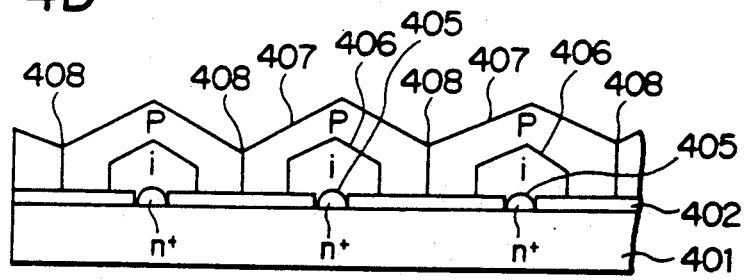

Gas composition: $SiH_2Cl_2$/HCl/$H_2$
Gas flow rate: 0.53/1.6/100 (liter/min)
Temperature: 990° C.
Pressure: 150 torr At the initial stage of selective epitaxial growth the non-doped Si monocrystal layer 406 was grown to a size of 10 μm without introducing a dopant, and with the use of $B_2H_6$ as the dopant source in the intermediate stage, the p-type crystal layer 407 was grown (FIG. 4D).

When crystals grow and crystals adjacent to each other are collided against each other, a grain boundary 408 is formed at the substantially middle position between the contact holes. The size of the grain at this time is substantially equal to the distance 50 μm between the pitches of the contact holes. The crystals were continued to grow even after collision of the grains against each other, and the growth was stopped when the height of the crystal (top of mountain) became about 30 μm. As to the outer shape of the crystals, a facet inherent in Si crystal was seen, indicating that each is a monocrystal. Also, because the crystal is surrounded with facet, although the surface shape has excessive unevenness, in the case of a solar battery, such unevenness can become the so-called texture structure for utilizing efficiently the irradiated light, thus becoming a factor for improvement of conversion efficiency. When a device is formed on the crystal, for example, the surface may be flattened by polishing.

Figure 4E:
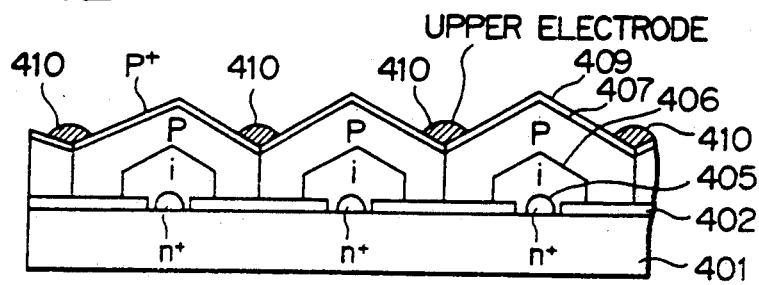

(E) Next, for taking an upper electrode, B+ ions were ion injected into the Si crystal surface to form a layer region 409 of the p+ type, and further Ti-Ag was mask vapor deposited by the sputtering method at the upper electrode 410 along the valley of the facet to form a solar battery (FIG. 4E).

The solar battery thus formed was found to have good electrical contact between the lower metal electrode 401 and the n+ type monocrystal 405 and also a monocrystal semiconductor with excellent photoelectric conversion efficiency in the photoelectric conversion region, and therefore having high conversion efficiency and reliability.

EXAMPLE 2

Figure 5A:
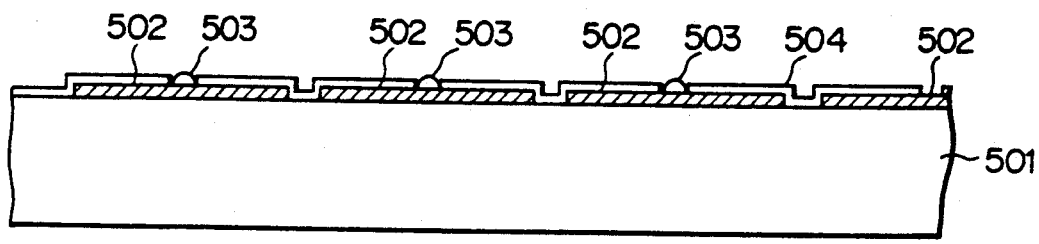
FIGS. 5A to 5C are schematic illustrations of the process for forming a photosensor according to a second example.
Figure 5B:
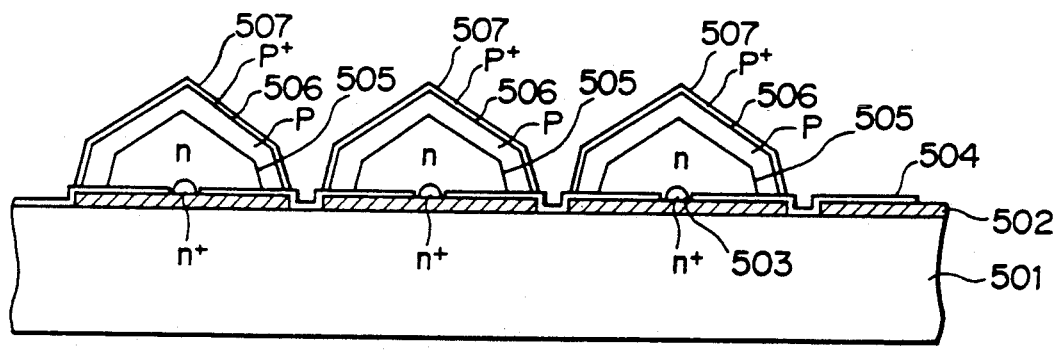
Figure 5C:
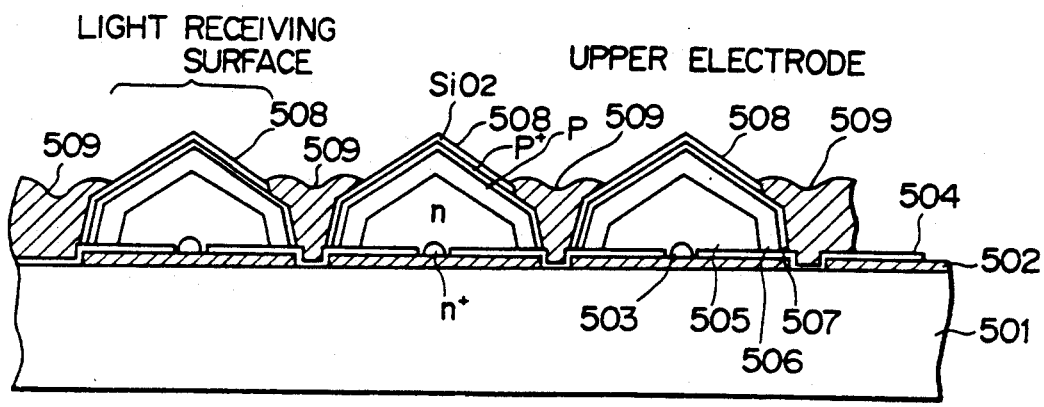

FIGS. 5A to 5C show diagramatically a photosensor formed as another example. The formation method is described below by referring to FIGS. 5A to 5C.

(A) On a subbing material 501 comprising quartz glass a tungsten film was deposited according to the sputtering method to a thickness of 0.5 μm. And, said tungsten film removed by etching except for allowing the region of the lower electrode 502 of 30 μm × 30 μm and the wiring portion from that region to remain.

Next, according to the same method as in Example 1 previously described, cohering body 503 of n+-monocrystal was formed only on the contact point exposed from the opening of the insulating layer 504 comprising the SiO₂ layer (FIG. 5A).

(B) Next, with the above n+-Si monocrystalline cohering body 503 as the seed, crystals were selectively grown by varying continuously the doping gases in the order of the n type and the p type, thereby forming the n type monocrystal layer 505 and the p type monocrystal layer 506. The growth conditions are the same as in the previous Example 1. The crystal growth treatment was performed for 50 minutes which was the crystal growth treatment time previously determined by experimentation so that the growth was completed before mutual collision between adjoining crystals.

Next, for contact with the upper electrode, B+ ions were ion injected into the whole surface to make the surface the p+ type, thereby forming 507 layer of the p+ type (FIG. 5B).

(C) For complete insulating separation of individual crystals, the surface was thermally oxidized to form a SiO₂ layer 508, then the oxide film at the peripheral portion of each crystal etched to have the surface of the p+ type 507 exposed at the peripheral portion, thereby forming the contact hole for contact with the upper electrode 509. Subsequently, the upper electrode 509 was formed at the contact point exposed from the contact hole by the mask vapor deposition method, thus forming a photosensor.

The photosensor thus formed has a monocrystal semiconductor region of high sensitivity provided at the desired sensor picture element on the substrate, and also has good electrical contact with the lower electrode 502, and hence has good response of high sensitivity which is faithful to the incident light.

EXAMPLE 3

A solar battery was formed in the same manner as in Example 1 except for changing the annealing conditions to those as shown below.
Annealing atmosphere:
  hydrogen 80% argon 20%
Annealing temperature: 1050° C.
Annealing pressure: 100 Torr
Annealing time: 12 minutes According to this example, a solar battery exhibiting good characteristics similarly as in Example 1 could be formed.

EXAMPLE 4

On a lower metal electrode 601 comprising a tungsten plate, an amorphous silicon oxide film 602 was formed with a thickness of 2000 Å by the CVD method, and a polycrystalline silicon film with phosphorus being diffused to the saturated state by the use of POCl₃ was formed thereon with a thickness of 4000 Å. Subsequently, according to photolithography and dry etching process the polycrystalline silicone film was etched to have islands of square forms of 1.5 μm remain with other portions being removed, thereby forming a substrate having polycrystalline original seeds 603 provided with 50 μm pitch (FIG. 6A).

The substrate was annealed in H₂ atmosphere under the conditions of a temperature of 1030° C., a pressure of 100 Torr for 20 minutes.

Figures 6A, 6B:
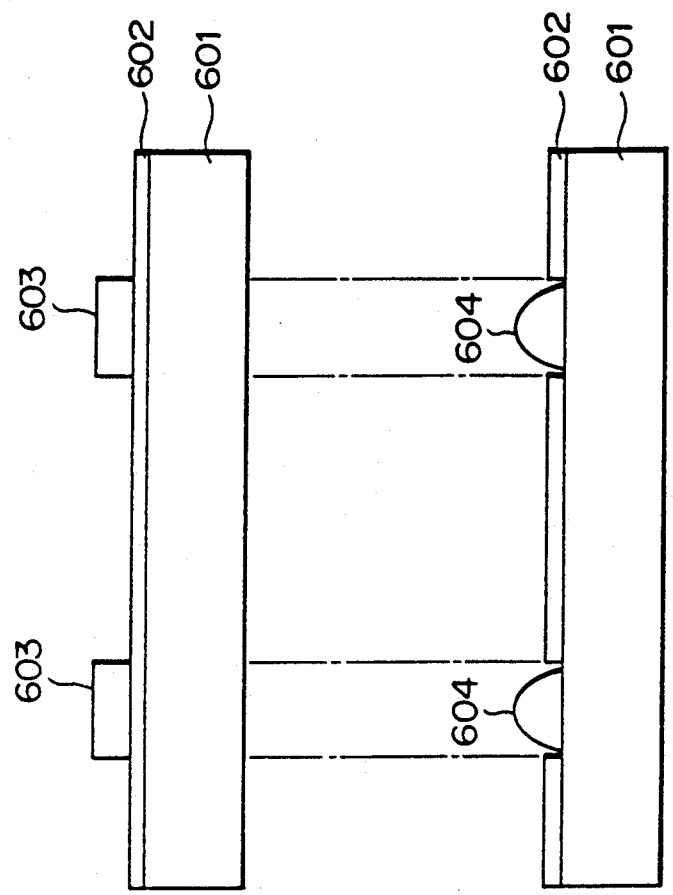
FIGS. 6A and 6B are schematic illustrations of another example.

By the above-described annealing, the polycrystalline seed grains 603 were made to cohere into a single cohering body and at the same time underwent the solid phase reaction with the silicon oxide film 602, thereby extinguishing the silicon oxide film 602 at the portions in contact with the original seeds 603, to form a monocrystalline seed 604 in ohmic contact with the lower metal electrode 601 comprising tungsten (FIG. 6B).

When a solar battery was formed on a substrate having the silicon oxide layer 602 having an opening on the lower metal electrode 601 thus formed by utilizing the cohesion reaction and the solid phase reaction and the monocrystalline seed 604 formed self-matching onto said opening, it was found to have good characteristics similarly as in Example 1.

What is claimed is:

1. A process of growing a monocrystal on an insulating film having at least one opening provided on a metal electrode, which comprises:
   providing a non-monocrystalline semiconductor film on a substrate having a metal electrode and an insulating film,
   causing said semiconductor film and said insulating film to undergo a solid phase reaction at the interface therebetween,
   forming a monocrystalline cohering body of said semiconductor film at each said opening of said insulating film by applying annealing for cohesion of said semiconductor film on said metal electrode, wherein said annealing and said solid phase reaction are carried out in an atmosphere containing hydrogen gas and
   allowing a monocrystal to grow with said monocrystalline cohering body as a seed.

2. A process according to claim 1, wherein said insulating film comprises silicon oxide.

3. A process according to claim 1, wherein said semiconductor film comprises silicon.

4. A process according to claim 1, wherein said semiconductor film contains an element of the group III of the periodic table.

5. A process according to claim 1, wherein said semiconductor film contains an element of the group V of the periodic table.

6. A process according to claim 1, wherein said annealing is carried out at a temperature of 850° C. or higher and not higher than the melting point of the semiconductor material.

7. A process according to claim 1, wherein a plurality of monocrystals are formed on said substrate.

8. A process according to claim 1, wherein said semiconductor film is provided on a substrate with said metal electrode exposed from each said opening of said insulating film.

9. A process according to claim 1, wherein said insulating film having the opening has a thickness which is thicker than that of said semiconductor film.

10. A process according to claim 1, wherein said semiconductor film is provided in contact with said insulating film and is sufficiently small to become a single cohering body by said solid phase reaction.

11. A process according to claim 1, wherein said semiconductor film has a thickness which is thicker than that of said insulating film.

12. A process of growing a semiconductor monocrystal on an insulating film having an opening provided on a metal electrode, which comprises:

providing a non-monocrystalline semiconductor thin film so as to cover a substrate having said insulating film and a metal electrode surface exposed from the opening of said insulating film with a thickness which is thinner than that of said insulating film, annealing said semiconductor thin film to effect the solid phase reaction between the insulating film and the semiconductor film, thereby removing only the semiconductor thin film existing on the insulating film, and also allowing the semiconductor thin film on the metal electrode to cohere so that a monocrystallized cohering body is formed, where said annealing is carried out in an atmosphere containing hydrogen gas and permitting a monocrystal to grow with said cohering body as a seed.

13. A process according to claim 12, wherein said insulating film comprises silicon oxide.

14. A process according to claim 12, wherein said semiconductor film comprises silicon.

15. A process according to claim 12, wherein said semiconductor film contains an element of the group III of the periodic table.

16. A process according to claim 12, wherein said semiconductor film contains an element of the group V of the periodic table.

17. A process according to claim 12, wherein said annealing is carried out at a temperature of 850° C. or higher and not higher than the melting point of the semiconductor material.

18. A process according to claim 12, wherein a plurality of monocrystals are formed on said substrate.

19. A process according to claim 12, wherein the opening of said insulating film has its maximum diameter of 5 $\mu$m.

20. A process of growing a monocrystal on an insulating film provided on a metal electrode, which comprises:

providing a semiconductor film which is non-monocrystalline and subjected to patterning, on said insulating film of a substrate having the metal electrode and the insulating film, annealing said semiconductor film to effect the solid phase reaction between said semiconductor film and said insulating film, thereby removing said insulating film at the portion where said semiconductor film subjected to patterning is provided, and effecting cohesion of said semiconductor film on said metal electrode to form a monocrystallized cohering body, wherein said annealing is carried out in an atmosphere containing hydrogen gas and permitting a monocrystal to grow with said cohering body as a seed.

21. A process according to claim 20, wherein said insulating film comprises silicon oxide.

22. A process according to claim 20, wherein said semiconductor film comprises silicon.

23. A process according to claim 20, wherein said semiconductor film contains an element of the group III of the periodic table.

24. A process according to claim 20, wherein said semiconductor film contains an element of the group V of the periodic table.

25. A process according to claim 20, wherein said annealing is carried out at a temperature of 850° C. or higher and not higher than the melting point of the semiconductor material.

26. A process according to claim 20, wherein a plurality of monocrystals are formed on said substrate.

27. A process according to claim 20, wherein said semiconductor film has a thickness which is thicker than that of said insulating film.

28. A process according to claim 20, wherein said insulating film has a maximum diameter of 5 $\mu$m.

* * * * *

UNITED STATES PATENT AND TRADEMARK OFFICE
CERTIFICATE OF CORRECTION

PATENT NO. : 5,236,544
DATED : August 17, 1993
INVENTOR(S) : KENJI YAMAGATA

It is certified that error appears in the above-identified patent and that said Letters Patent is hereby corrected as shown below:

ON TITLE PAGE

In [56] References Cited, under U.S. PATENT DOCUMENTS:
   "Matzuzawa et al." should read --Matsuzawa et al.--.
In [56] References Cited, under FOREIGN PATENT DOCUMENTS:
   "0210920  6/1987  Japan" should read
   --0210920  12/1987  Japan--.

COLUMN 3

Line 14, "rection" should read --reaction--.
Line 18, "an" should read --a--.
Line 24, "diagramatically" should read --diagrammatically--.
Line 27, "diagramati-" should read --diagrammati- --.

COLUMN 4

Line 15, "difficulty found" should read --difficulty, as found--.
Line 20, "On" should read --To-- and "case" should read --a case--.
Line 47, "cause" should read --caused--.

COLUMN 5

Line 9, "so called" should read --so-called--.
Line 13, "atomosphere" should read --atmosphere--.
Line 37, "cohesion occurs as" should be deleted.
Line 38, "divided into a plural number, whereby" should be deleted.

COLUMN 7

Line 6, "taking" should read --making--.

UNITED STATES PATENT AND TRADEMARK OFFICE
CERTIFICATE OF CORRECTION

PATENT NO. : 5,236,544
DATED : August 17, 1993
INVENTOR(S) : KENJI YAMAGATA

It is certified that error appears in the above-identified patent and that said Letters Patent is hereby corrected as shown below:

<u>COLUMN 7</u>

Line 22, "diagramatically" should read --diagrammatically--.
    Line 28, "removed" should read --was removed--.
    Line 50, "507 layer" should read --layer 507--.

<u>COLUMN 8</u>

Line 23, "silicone" should read --silicon--.
    Line 62, "gas and" should read --gas, and--.

<u>COLUMN 9</u>

Line 31, "cover" should read --cover over--.
    Line 43, "gas and" should read --gas, and--.

<u>COLUMN 10</u>

Line 28, "gas and" should read --gas, and--.

Signed and Sealed this

Thirty-first Day of May, 1994

Attest:

BRUCE LEHMAN

Attesting Officer     Commissioner of Patents and Trademarks